United States Patent [19]
Moriizumi et al.

[11] Patent Number: 5,608,192
[45] Date of Patent: Mar. 4, 1997

[54] MULTILAYER THIN-FILM WIRING BOARD

[75] Inventors: Kiyokazu Moriizumi; Kiyotaka Seyama, both of Kawasaki, Japan

[73] Assignee: Fujitsu Limited, Kanagawa, Japan

[21] Appl. No.: 506,918

[22] Filed: Jul. 26, 1995

[30] Foreign Application Priority Data

Jul. 28, 1994 [JP] Japan .................... 6-176582
Jul. 12, 1995 [JP] Japan .................... 7-176453

[51] Int. Cl.⁶ ................................. H05K 1/00
[52] U.S. Cl. .................. 174/255; 174/262; 361/792; 361/794; 361/777
[58] Field of Search ..................... 174/262, 261, 174/258, 255; 361/777, 778, 792, 793, 794, 795, 805; 439/74, 47, 48

[56] References Cited

U.S. PATENT DOCUMENTS

| | | | |
|---|---|---|---|
| 4,227,298 | 10/1980 | Keeling et al. | 29/837 |
| 4,438,560 | 3/1984 | Kisters | 29/830 |
| 4,524,239 | 6/1985 | Rouge | 174/68.5 |
| 4,524,240 | 6/1985 | Stock et al. | 174/68.5 |
| 4,560,962 | 12/1985 | Barrow | 333/1 |
| 4,616,292 | 10/1986 | Sengoku et al. | 361/414 |
| 5,003,374 | 3/1991 | Vokoun, II | 357/68 |

*Primary Examiner*—Laura Thomas
*Attorney, Agent, or Firm*—Armstrong, Westerman Hattori, McLeland & Naughton

[57] ABSTRACT

A multilayer thin-film wiring board formed by laminating at least three wiring layers including first, second, and third wiring layers together with a dielectric layer. The first wiring layer includes a first pattern having a plurality of first windows arranged with the same pitch both in a lateral direction and in a longitudinal direction of the wiring board, and a plurality of first island patterns each located at a substantially central portion of each first window. Similarly, the second wiring layer includes a second pattern having a plurality of second windows, and a plurality of second island patterns each located at a substantially central portion of each second window. The second windows are shifted from the first windows by half the pitch both in the lateral direction and in the longitudinal direction. The third wiring layer includes first and second via pads formed on a surface of the wiring board. The first via pad, the first pattern, and at least one of the second island patterns are connected together by a first via. The second via pad, the second pattern, and at least one of the first island patterns are connected together by a second via.

15 Claims, 9 Drawing Sheets

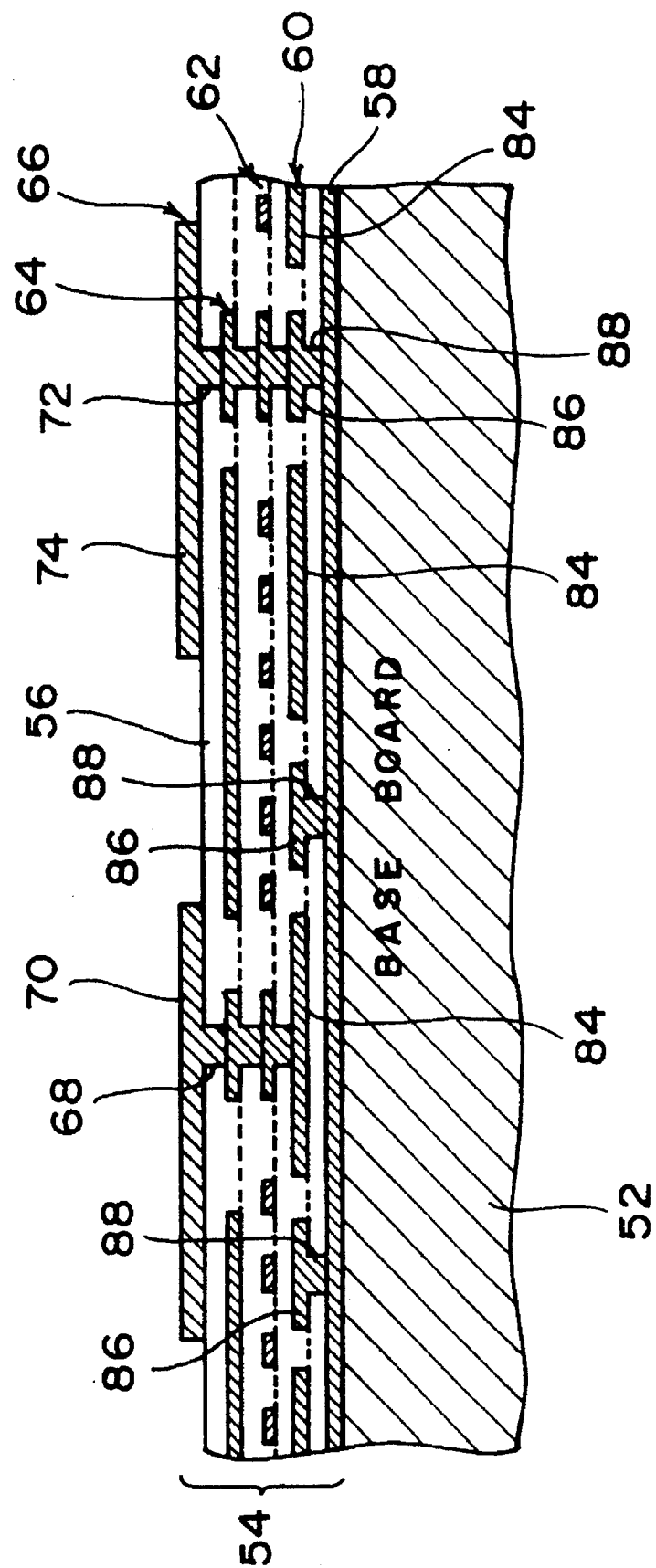

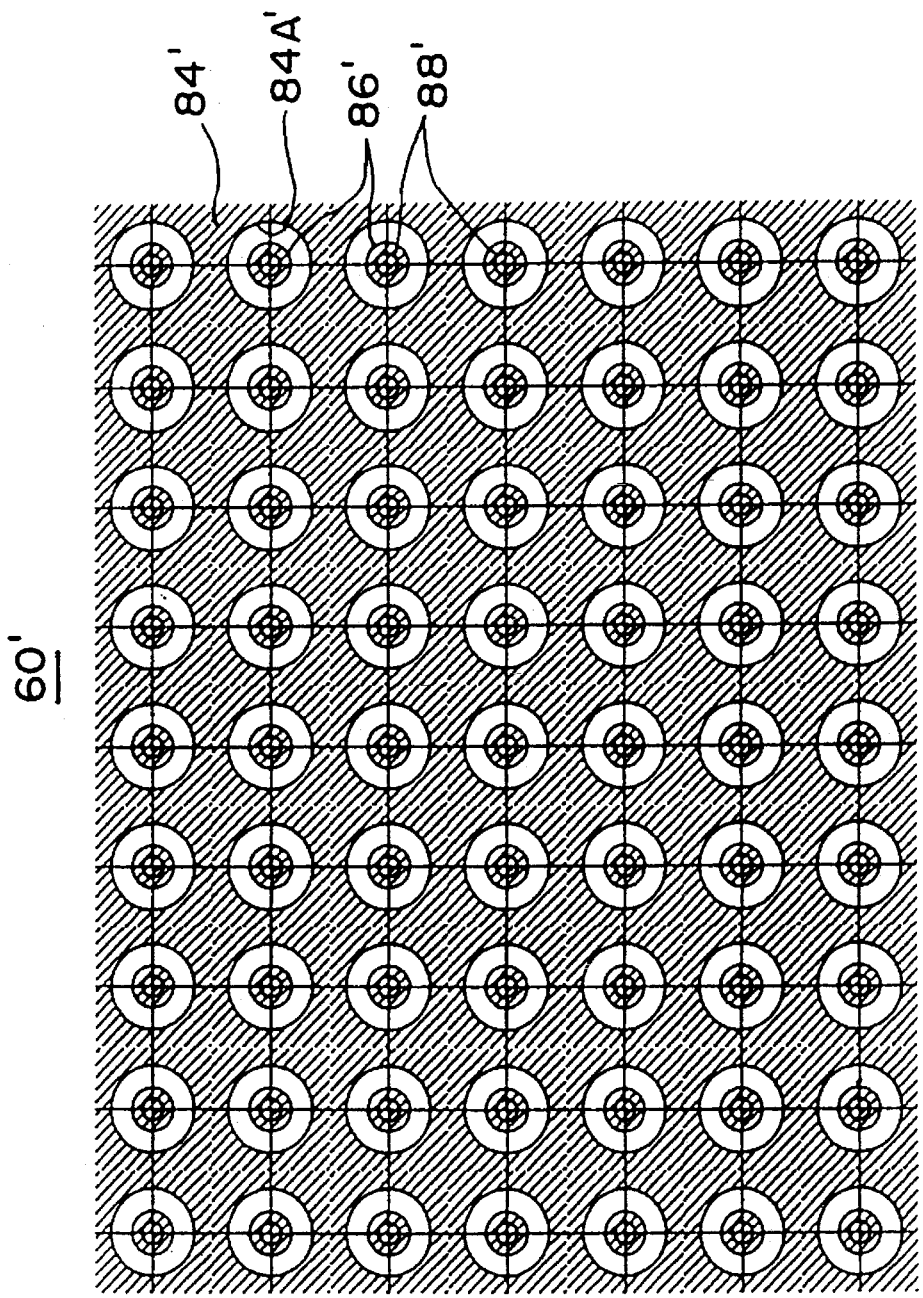

MULTILAYER THIN-FILM WIRING BOARD

BACKGROUND OF THE INVENTION

1. Field of the Invention

The present invention relates generally to a multi-layer thin-film wiring board on which electronic components such as LSIs are mounted, and more particularly to a multilayer thin-film wiring board applicable to an MCM (multichip module) allowing high-density wiring.

2. Description of the Related Art

In recent years, a thin-film wiring board allowing high-density wiring, or a so-called MCM (multichip module) board, has been put to practical use. The MCM board usually employs polyimide as the material of a dielectric. A very thin dielectric layer can be formed by spin coating. Further, a signal pattern is formed by sputtering and etching using a high-sensitive resist. Accordingly, the pattern can be formed with a high density incomparable with that of a usual printed wiring board. For example, the requirement of wiring of all signal lines can be met by only two layers, thus allowing high-density wiring. In manufacturing a multilayer thin-film wiring board to be applied to such an MCM board, the common use of components such as a power supply layer and a ground layer in the multilayer thin-film wiring board is desired to reduce the costs in flexible manufacturing.

Conventionally known is a multilayer thin-film wiring board formed by laminating a plurality of wiring layers together with a dielectric layer. The wiring layers are, for example, a power supply layer, a ground layer, and a signal layer. The power supply layer and the ground layer are connected through vias to via pads formed on the surface of the wiring board, and electric power is supplied from either via pad through a footprint to a component such as an LSI. The signal layer is composed of two layers as two separated orthogonal components, i.e., X and Y components.

In applying the conventional multilayer thin-film wiring board mentioned above to flexible manufacturing, the pattern shapes of the power supply layer and the ground layer are specifically designed for various products, and the commonality of these wiring layers is limited.

SUMMARY OF THE INVENTION

It is therefore an object of the present invention to provide a multilayer thin-film wiring board having wiring layers which can be easily put to common use in flexible manufacturing.

According to the first aspect of the present invention, there is provided a multilayer thin-film wiring board comprising: a dielectric layer; at least three wiring layers including first, second, and third wiring layers laminated with each other through the dielectric layer; the first wiring layer including a first pattern having a plurality of first windows arranged with the same pitch both in a lateral direction and in a longitudinal direction of the wiring board, and a plurality of first island patterns each located at a substantially central portion of each of the first windows; the second wiring layer including a second pattern having a plurality of second windows arranged with the same pitch both in the lateral direction and in the longitudinal direction, and a plurality of second island patterns each located at a substantially central portion of each of the second windows; the second windows of the second pattern being shifted from the first windows of the first pattern by half the pitch both in the lateral direction and in the longitudinal direction; the third wiring layer including first and second via pads formed on a surface of the wiring board; a first via connecting the first via pad, the first pattern, and at least one of the second island patterns; and a second via connecting the second via pad, the second pattern, and at least one of the first island patterns.

In the first aspect of the present invention, the first and second patterns both having a regular shape are shifted from each other by half the pitch. The first and second patterns are connected through the first and second vias to the first and second via pads formed on the surface of the wiring board, respectively. Accordingly, the first and second patterns may be used as a power supply layer and a ground layer, respectively. In this manner, the first and second patterns both having a regular shape are so positioned as to have a specific relationship therebetween in the present invention, thereby facilitating the common use of the wiring layers.

According to the second aspect of the invention, there is provided a multilayer thin-film wiring board comprising: a dielectric layer; at least three wiring layers including first, second, and third wiring layers laminated with each other through the dielectric layer; the first wiring layer including a pattern having a plurality of windows, and a plurality of island patterns each located at a substantially central portion of each of the windows; the second wiring layer including a plain pattern uniformly spread; the third wiring layer including first and second via pads formed on a surface of the wiring board; a first via connecting the first via pad and the pattern; a second via connecting the second via pad and at least one of the island patterns; and a plurality of third vias connecting the island patterns and the plain pattern.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 6 is a sectional view of an MCM board to which the second aspect of the present invention is applicable;

FIG. 9 is a plan view showing a modification of the power supply layer in the preferred embodiment according to the second aspect of the present invention.

DESCRIPTION OF THE PREFERRED EMBODIMENTS

Some preferred embodiments of the present invention will now be described in detail with reference to the accompanying drawings.

Figure 1:
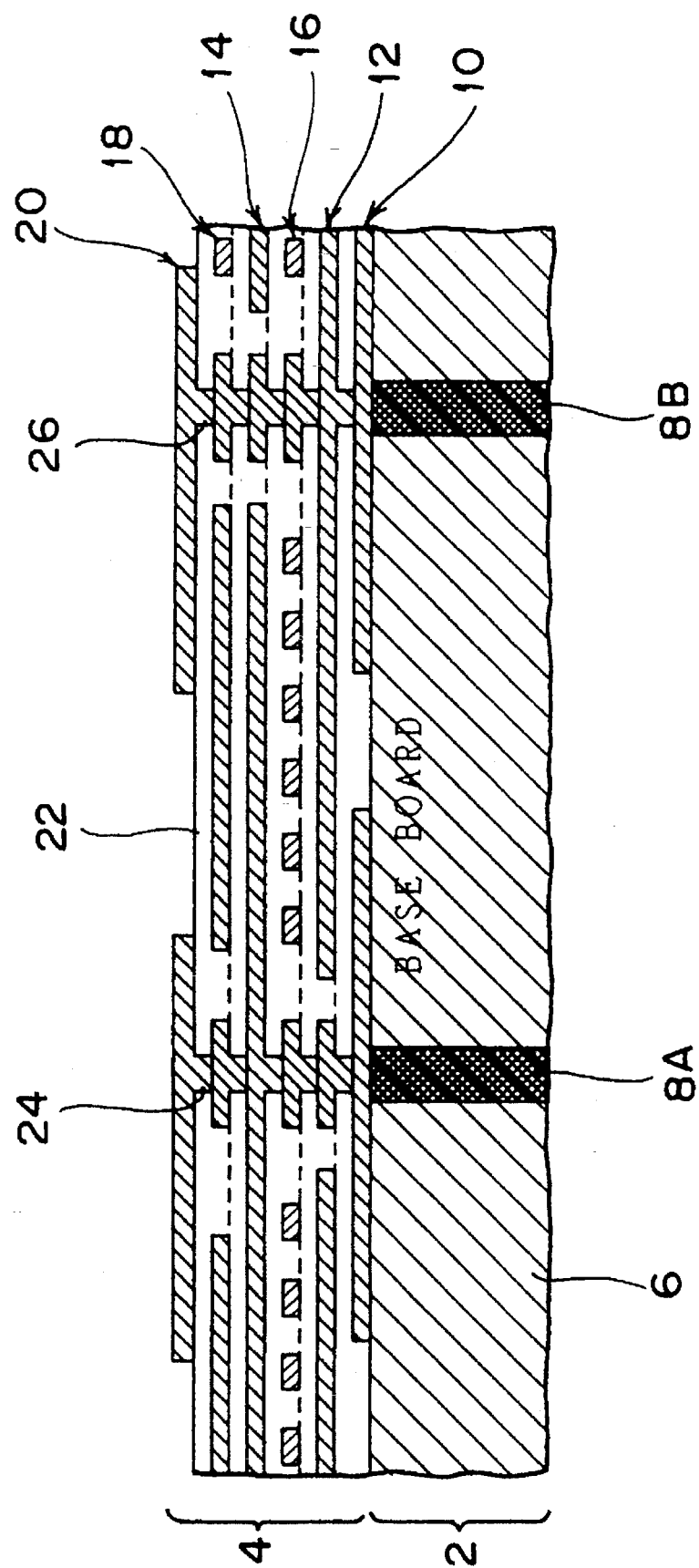
FIG. 1 is a sectional view of an MCM (multichip module) board to which the first aspect of the present invention is applicable.

FIG. 1 is a sectional view of an MCM board to which the first aspect of the present invention is applicable. The MCM board is constructed by laminating a thin-film board 4 on a thick-film board 2. The thick-film board 2 has a thick-film layer 6 formed by firing ceramics and thick-film vias 8 (8A and 8B) buried in the thick-film layer 6. The thin-film board 4 is constructed by laminating a plurality of wiring layers with a dielectric layer 22 formed of polyimide or the like. In this example shown, the wiring layers are a connection layer 10, ground layer 12, X signal layer 16, power supply layer 14, Y signal layer 18, and surface layer 20 laminated in this order from the side of the thick-film board 2. Each wiring layer is formed of copper, for example. A left portion of the surface layer 20 is connected through a via 24 to the power supply layer 14 and thick-film via 8A, and a right portion of the surface layer 20 is connected through a via 26 to the ground layer 12 and thick-film via 8B.

Figure 2A:
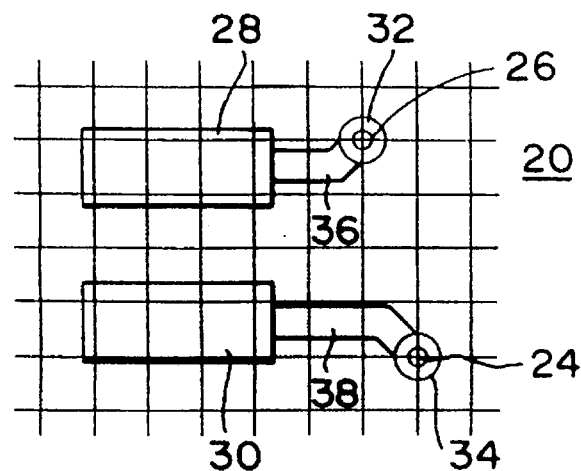
FIGS. 2A, 2B, and 2C are plan views of a surface layer, a power supply layer, and a ground layer, respectively, in the prior art.
Figure 2B:
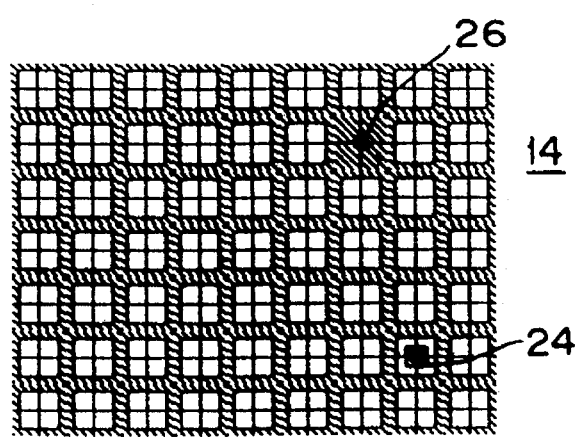
Figure 2C:
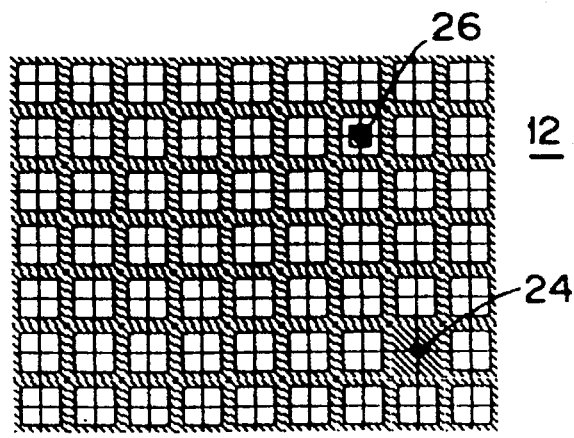

FIGS. 2A, 2B, and 2C are plan views of the surface layer 20, the power supply layer 14, and the ground layer 12, respectively, in the case that the prior art is applied to the MCM board shown in FIG. 1. Any positions specified by the crossing lateral and longitudinal lines shown in FIGS. 2A to 2C are in coincidence with each other. The surface layer 20 includes footprints 28 and 30, via pads 32 and 34, and connection lines 36 and 38. The connection line 36 connects the footprint 28 and the via pad 32, and the via pad 32 is connected to the via 26. The connection line 38 connects the footprint 30 and the via pad 34, and the via pad 34 is connected to the via 24. Accordingly, the footprint 28, the via pad 32, and the connection line 36 correspond to the right portion of the surface layer 20 shown in FIG. 1, and the footprint 30, the via pad 34, and the connection line 38 correspond to the left portion of the surface layer 20 shown in FIG. 1. For example, leads of an LSI (not shown) are connected by soldering to the footprints 28 and 30.

As shown in FIGS. 2B and 2C, each of the power supply layer 14 and the ground layer 12 has a substantially lattice-shaped pattern, and is formed with a plurality of windows regularly arranged except a portion to be connected to the via 26 or 24. Accordingly, the footprint 28 is connected through the via 26 to the power supply layer 14, and the footprint 30 is connected through the via 24 to the ground layer 12.

As apparent from FIGS. 2B and 2C, in changing the position of the via pad 32 or 34, the shapes of the power supply layer 14 and the ground layer 12 must be redesigned. Accordingly, it is difficult to commonly use the power supply layer and the ground layer in flexible manufacturing.

Figure 3A:
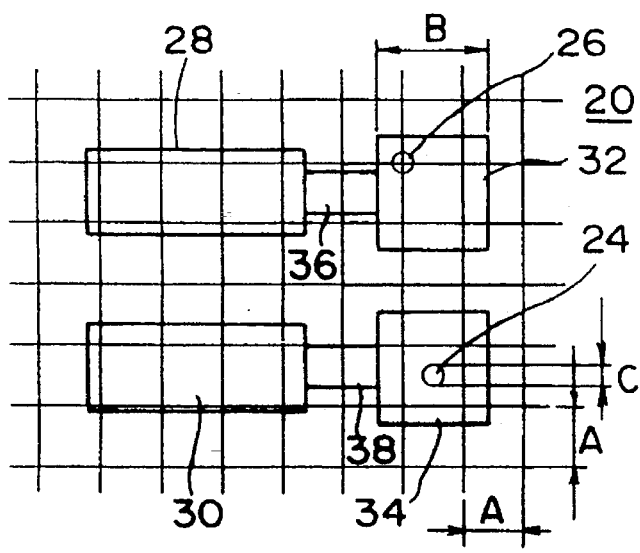
FIGS. 3A, 3B, and 3C are plan views of a surface layer, a power supply layer, and a ground layer in a preferred embodiment according to the first aspect of the present invention.
Figure 3B:
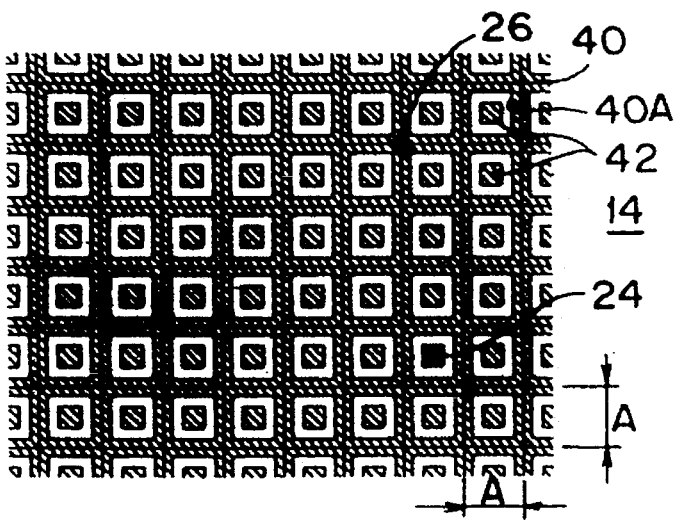
Figure 3C:
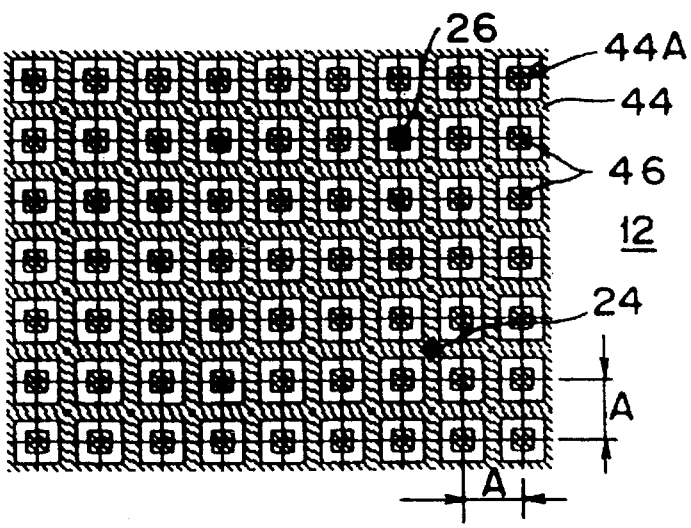

FIGS. 3A, 3B, and 3C show the wiring layers 20, 14, and 12 according to a preferred embodiment according to the first aspect of the present invention. In these figures, the same parts as those shown in FIGS. 1, 2A, 2B, and 2C are denoted by the same reference numerals. As shown in FIG. 3B, the power supply layer 14 includes a power supply pattern 40 having a plurality of square windows 40A arranged with the same pitch both in the lateral direction and in the longitudinal direction, and a plurality of square island patterns 42 each located at a substantially central portion of each window 40A. Further, as shown in FIG. 3C, the ground layer 12 includes a ground pattern 44 having a plurality of square windows 44A, and a plurality of square island patterns 46 as similar to the power supply layer 14. The windows 40A of the power supply pattern 40 are so located as to be shifted from the windows 44A of the ground pattern 44 by half the pitch both in the lateral direction and in the longitudinal direction. The pitch of the windows 40A of the power supply pattern 40 is the same as the pitch of the windows 44A of the ground pattern 44, and this same pitch is shown by A both in the lateral direction and in the longitudinal direction.

In this preferred embodiment, each of the via pads 32 and 34 is square and the length of each side is shown by B. Further, the vias 24 and 26 have the same diameter shown by C. The shape of each pattern is set so as to satisfy the inequality expressed by A+C<B. By satisfying this condition, the via pad 32 can be connected through the via 26 to the power supply pattern 40, and the via pad 34 can be connected through the via 24 to the ground pattern 44 irrespective of the positions of the via pads 32 and 34 on the surface of the thin-film board 4. In this condition, the via 26 is connected to one of the island patterns 46 in such a manner as to pass through the corresponding window 44A of the ground pattern 44 in the ground layer 12, while the via 24 is connected to one of the island patterns 42 in such a manner as to pass through the corresponding window 40A of the power supply pattern 40 in the power supply layer 14.

As apparent from FIGS. 3B and 3C, the shape of the power supply layer 14 is the same as that of the ground layer 12, and the same shape is a regular shape. Accordingly, even in changing the positions of the footprints and the via pads to obtain different products, it is unnecessary to change the power supply layer 14 and the ground layer 12, thereby reducing a man-hour for designing a multilayer thin-film wiring board.

Figure 4:
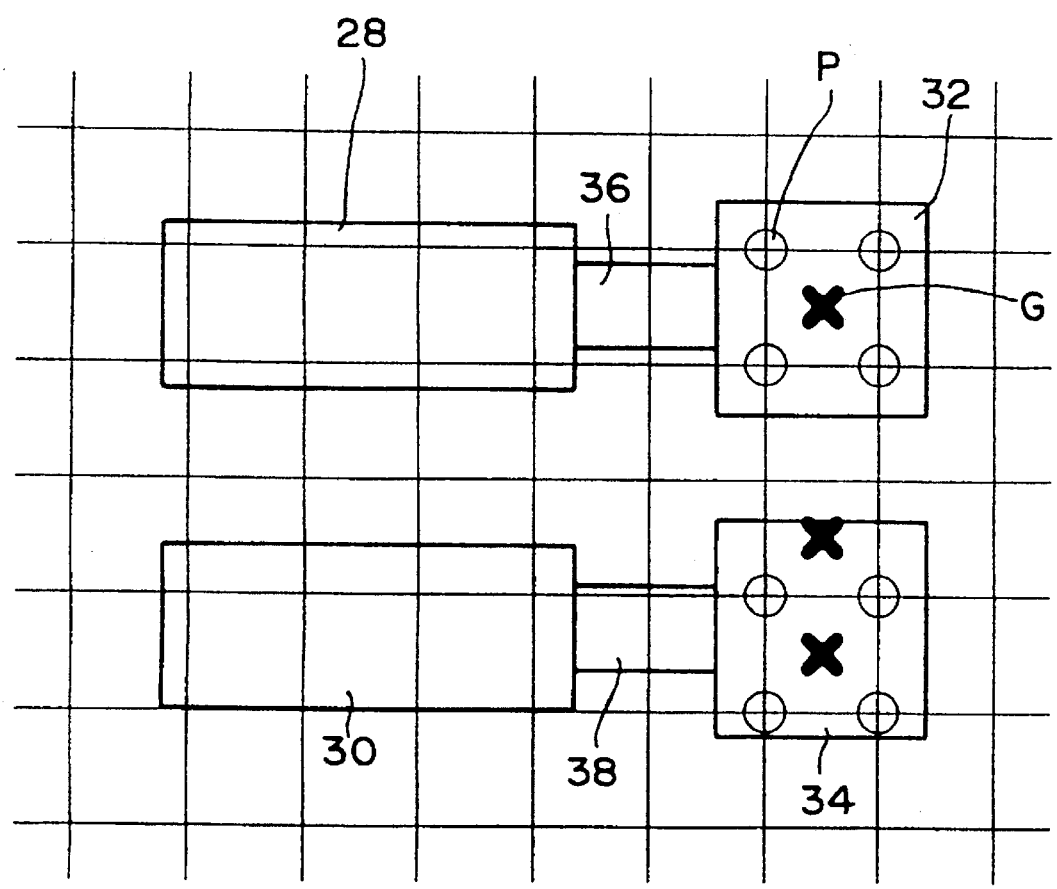
FIG. 4 is a plan view illustrating settable positions of vias.

FIG. 4 is a plan view illustrating the settable positions of the vias in the case where the above-mentioned inequality is satisfied. FIG. 4 corresponds to FIG. 3A, and the crossing lateral and longitudinal lines shown in FIG. 4 are in coincidence with those shown in FIG. 3A. The via 26 to be connected to the power supply pattern 40 can be set at the intersection of two crossing lateral and longitudinal lines as shown by reference character P, whereas the via 24 to be connected to the ground pattern 44 can be set at the substantially central position in a space defined by two adjacent lateral lines and two adjacent longitudinal lines as shown by reference character G.

According to this preferred embodiment as mentioned above, the size of each via pad used is set larger than the pitch of the windows by the diameter of each via. Therefore, each via pad can be connected to either the power supply layer or the ground layer irrespective of the position of the via pad. Although both the power supply pattern and the ground pattern are shaped like a grid with the square windows opened in this preferred embodiment, the shape of each pattern is not limited to this shape in the present invention.

Figure 5:
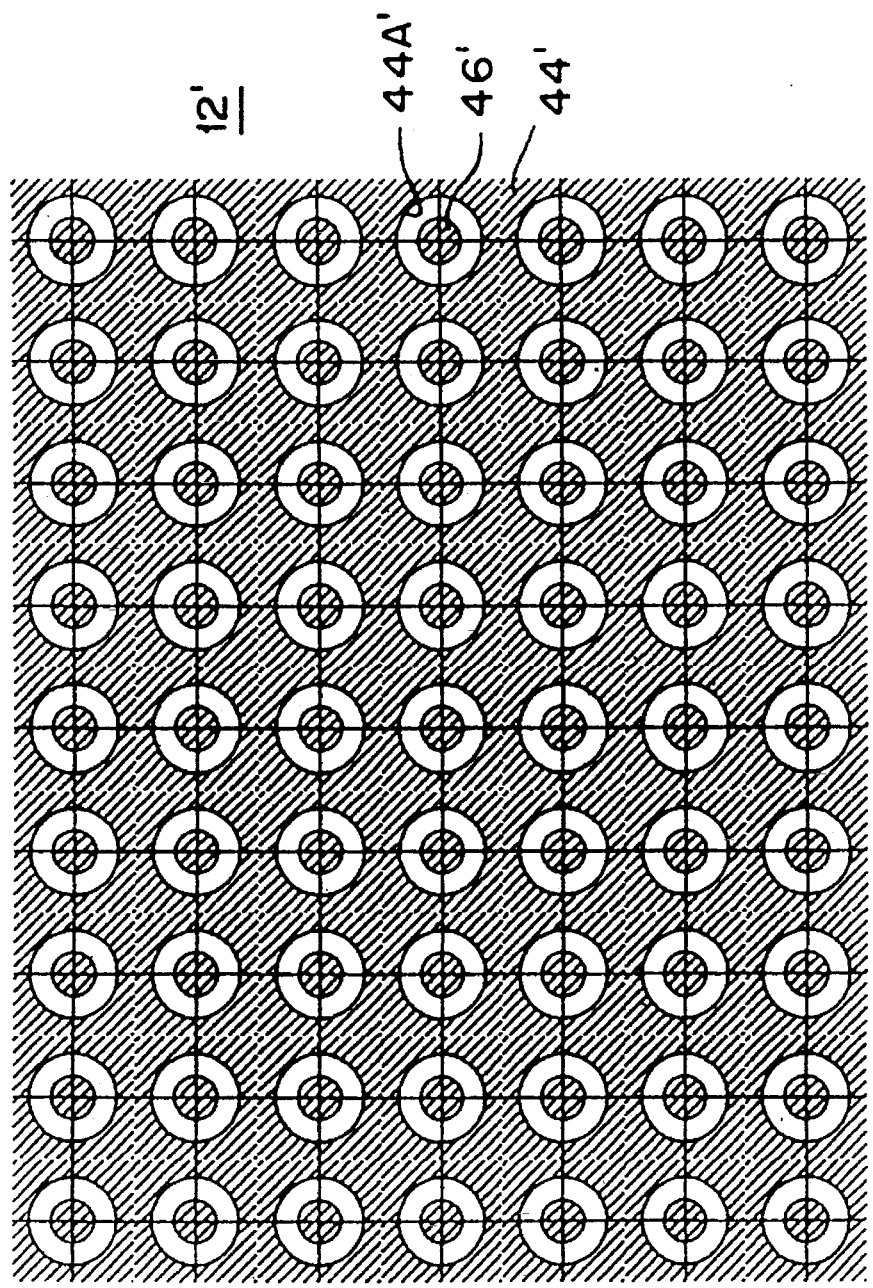
FIG. 5 is a plan view of a wiring layer in another preferred embodiment according to the first aspect of the present invention.

FIG. 5 is a plan view of a wiring layer in another preferred embodiment according to the first aspect of the present invention. FIG. 5 shows a ground layer 12' corresponding to FIG. 3C. The ground layer 12' includes a ground pattern 44' having a plurality of circular windows 44A' arranged with the same pitch both in the lateral direction and in the longitudinal direction, and a plurality of circular island patterns 46' each located at a substantially central portion of each window 44A'. Although not shown, a power supply layer similar in shape to the ground layer 12' is used to thereby connect the power supply layer and the ground layer to the respective via pads formed on the surface of the thin-film board as similarly to the previous preferred embodiment. Also in the preferred embodiment as shown in FIG. 5, the shape of each wiring layer is regular to allow easy common use of the wiring layers in flexible manufacturing.

FIG. 6 is a sectional view of an MCM board to which the second aspect of the present invention is applicable. The MCM board is constructed by laminating a thin-film board 54 on a thick-film board 52 formed of ceramic. The thin-film board 54 is constructed by laminating a plurality of wiring layers with a dielectric layer 56 formed of polyimide or the like. Each wiring layer is formed of copper, for example. More specifically, the wiring layers are a ground layer (plain pattern) 58, power supply layer 60, X signal layer 62, Y signal layer 64, and surface layer 66 laminated in this order from the side of the thick-film board 52. The surface layer 66 includes a power supply via pad 70 connected through a via 68 to the power supply layer 60 and a ground via pad 74 connected through a via 72 to the ground layer 58.

Figure 7A:
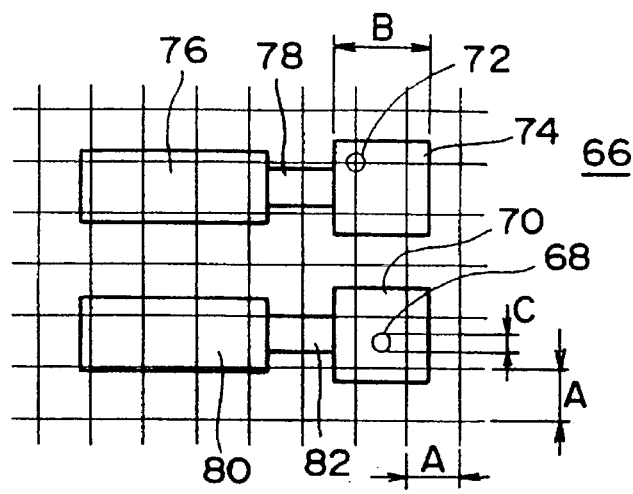
FIGS. 7A, 7B, and 7C are plan views of a surface layer, a power supply layer, and a ground layer, respectively, in a preferred embodiment according to the second aspect of the present invention.
Figure 7B:
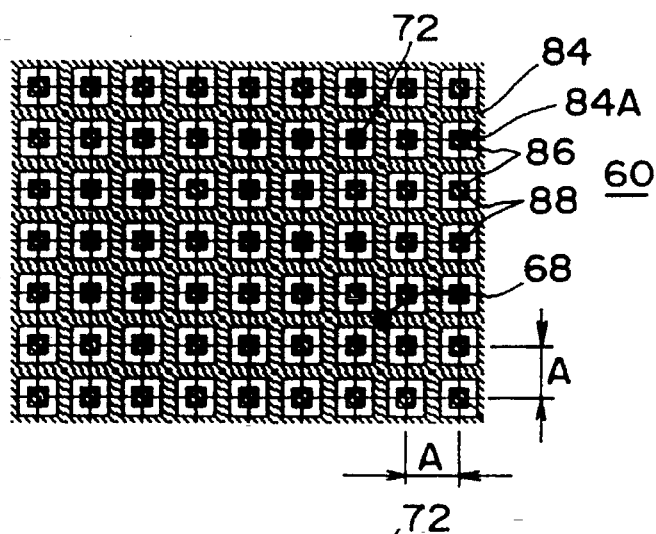
Figure 7C:
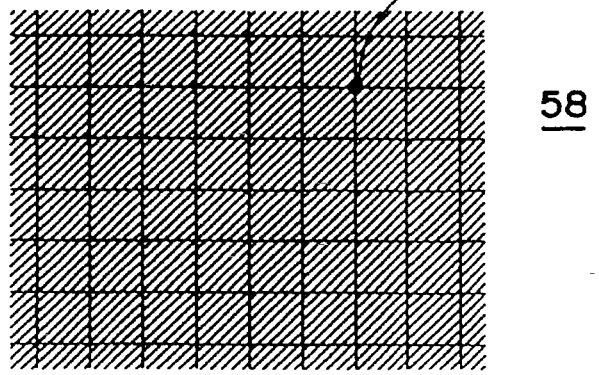

FIGS. 7A, 7B, and 7C are plan views of the surface layer 66, the power supply layer 60, and the ground layer 58, respectively, in a preferred embodiment according to the second aspect of the present invention. As shown in FIG. 7A, the surface layer 66 further includes a footprint 76, a connection line 78 connecting the footprint 76 to the ground via pad 74, a footprint 80, and a connection line 82 connecting the footprint 80 to the power supply via pad 70. The footprints 76 and 80 are provided to connect the ground layer 58 and the power supply layer 60, respectively, to power supply lines or electronic components (both not shown). As shown in FIG. 7B, the power supply layer 60 includes a power supply pattern 84 having a plurality of windows 84A and a plurality of island patterns 86 each located at a substantially central portion of each window 84A. In this preferred embodiment, each window 84A is square in shape, and all the windows 84A are regularly arranged with the same pitch both in the lateral direction and in the longitudinal direction. Each island pattern 86 is also square in shape as corresponding to the shape of each window 84A.

The feature of this preferred embodiment is that all the island patterns 86 are connected through a plurality of ground vias 88, respectively, to the ground layer 58 shown in FIG. 7C. This feature has the following merit. It is assumed that this preferred embodiment also satisfies the condition conforming with that of the inequality described with reference to FIG. 3A. That is, it is assumed that the shape of each pattern is set so as to satisfy the inequality expressed by A+C<B, where A denotes the pitch of the windows 84A of the power supply pattern 84; B denotes the length of each side of each of the via pads 70 and 74 which are square in shape; and C denotes the diameter of each of the vias 68 and 72. By satisfying this condition, the power supply via pad 70 can be connected through the via 68 to the power supply pattern 84, and the ground via pad 74 can be connected through the via 72 to one of the island patterns 86 irrespective of the positions of the power supply via pad 70 and the ground via pad 74 on the surface of the MCM board. Each island pattern 86 is connected through the corresponding ground via 88 characteristic of this preferred embodiment to the ground layer 58, with the result that the ground via pad 74 is connected through the via 72, one of the island patterns 86, and the corresponding ground via 88 to the ground layer 58.

In other words, this preferred embodiment has another effect that at least a part of the MCM board can be used for general purpose, in addition to the effect of the preferred embodiment according to the first aspect of the present invention. More specifically, a part of the laminated structure shown in FIG. 6, that is, the part consisting of the thick-film board 52, the ground layer 58, the ground vias 88, the power supply layer 60 (the power supply pattern 84 and the island patterns 86), and a part of the dielectric layer 56 interposed between the ground layer 58 and the power supply layer 60, can be used as a common part irrespective of the pattern shapes of the signal layers 62 and 64 and the surface layer 66. This effect is greatly significant in practical use. For example, the common part including the thick-film board 52, the ground layer 58, and the power supply layer 60 may be previously manufactured in a large amount to be stocked. Then, the common part thus stocked may be suitably applied according to the different pattern shapes of the signal layers etc. for various kinds of products.

Figure 8A:
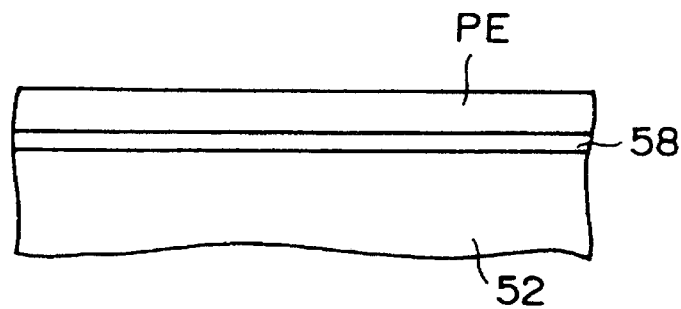
FIGS. 8A, 8B, 8C and 8D are views for illustrating an example of a manufacturing process for the common part of the MCM board.
Figure 8B:
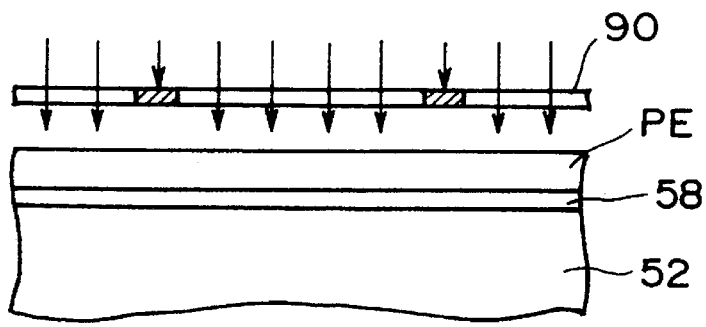
Figure 8C:
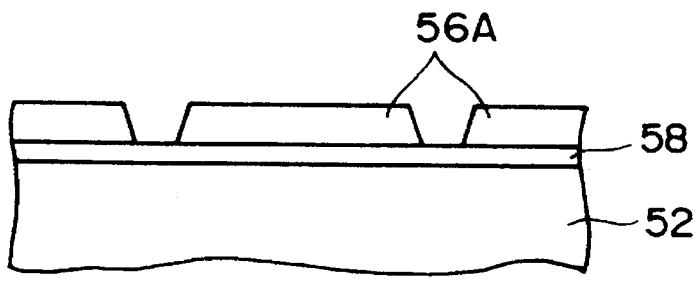
Figure 8D:
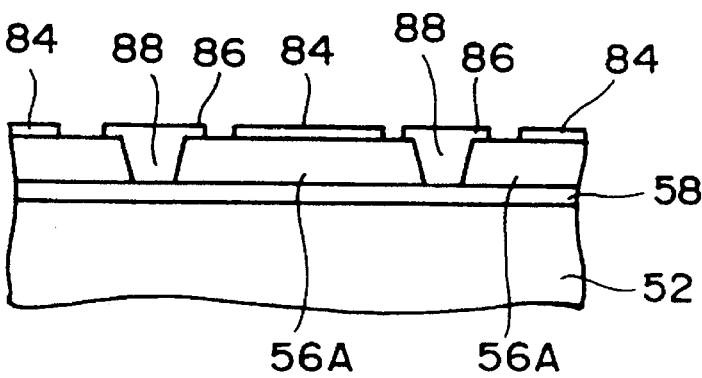

FIGS. 8A to 8D are views for illustrating an example of a manufacturing process for the common part of the MCM board mentioned above. As shown in FIG. 8A, the ground layer 58 as the plain pattern is first formed on the thick-film board 52 by a usual method. Thereafter, polyimide for forming a part of the dielectric layer 56 is applied to the ground layer 58 to form a polyimide layer PE having a uniform thickness. Then, as shown in FIG. 8B, the polyimide layer PE is exposed to light by the use of a mask 90, and development is thereafter performed. As a result, a part of the polyimide layer PE is solidified by the exposure and the development to be left on the ground layer 58. This part constitutes a part 56A of the dielectric layer 56 having a predetermined shape (FIG. 8C). Then, a mask having a predetermined shape is placed on the board formed with the part 56A of the dielectric layer 56, and sputtering, for example, is performed to form a conductor layer on the board. Thereafter, the mask is removed to form the ground vias 88, the power supply pattern 84 and the island patterns 86 of the power supply layer 60 (see FIG. 6). This manufacturing process may also be applied to the fabrication of each wiring layer in the preferred embodiment according to the first aspect of the present invention.

FIG. 9 is a plan view showing a modification of the power supply layer in the preferred embodiment according to the second aspect of the present invention. FIG. 9 shows a power supply layer 60' similar to the power supply layer 60 shown in FIG. 7B. The power supply layer 60' includes a power supply pattern 84' having a plurality of circular windows 84A' regularly arranged with the same pitch both in the lateral direction and in the longitudinal direction and a plurality of circular island patterns 86' each located at a substantially central portion of each window 84A'. A ground via 88' is located at the center of each island pattern 86'. As similar to the effect by the use of the power supply layer 60 shown in FIG. 7B, the use of the power supply layer 60' can exhibit an effect that the power supply layer 60' and the ground layer 58 can be connected to the power supply via pad 70 and the ground via pad 74, respectively.

Having thus described specific preferred embodiments of the present invention, it should be understood that the preferred embodiments are merely illustrative and not limitative. For example, although the pitch of the windows of the ground pattern is the same as the pitch of the windows of the power supply pattern in each of the preferred embodiments according to the first aspect of the invention, these pitches may be made different. For example, the ratio between these pitches may be set to a simple integral ratio. It is to be noted that the scope of the invention is set out in the appended claims, and all changes and modifications that fall within equivalence of the claims are intended to be embraced by the claims.

What is claimed is:

1. A multilayer thin-film wiring board comprising:

a dielectric layer;

at least three wiring layers including first, second, and third wiring layers laminated with each other through said dielectric layer;

said first wiring layer including a first pattern having a plurality of first windows arranged with the same pitch both in a lateral direction and in a longitudinal direction of said wiring board, and a plurality of first island patterns each located at a substantially central portion of each of said first windows;

said second wiring layer including a second pattern having a plurality of second windows arranged with the same pitch both in the lateral direction and in the longitudinal direction, and a plurality of second island patterns each located at a substantially central portion of each of said second windows;

said second windows of said second pattern being shifted from said first windows of said first pattern by half the pitch both in the lateral direction and in the longitudinal direction;

said third wiring layer including first and second via pads formed on a surface of said wiring board;

a first via connecting said first via pad, said first pattern, and at least one of said second island patterns; and a second via connecting said second via pad, said second pattern, and at least one of said first island patterns.

2. A multilayer thin-film wiring board according to claim 1, wherein the pitch of said first windows is equal to the pitch of said second windows.

3. A multilayer thin-film wiring board according to claim 1, wherein said first windows and said second windows are square.

4. A multilayer thin-film wiring board according to claim 3, wherein said first via pad and said second via pad are square, and the length of each side of said first via pad is larger than the sum of the pitch of said first windows and the diameter of said first via.

5. A multilayer thin-film wiring board according to claim 1, wherein said first windows and said second windows are circular.

6. A multilayer thin-film wiring board according to claim 1, wherein said first pattern forms a power supply layer, and said second pattern forms a ground layer.

7. A multilayer thin-film wiring board according to claim 1, wherein said dielectric layer is formed of polyimide.

8. A multilayer thin-film wiring board according to claim 7, further comprising a thick-film layer formed of ceramics.

9. A multilayer thin-film wiring board comprising:

a dielectric layer;

at least three wiring layers including first, second, and third wiring layers laminated with each other through said dielectric layer;

said first wiring layer including a pattern having a plurality of windows, and a plurality of island patterns each located at a substantially central portion of each of said windows;

said second wiring layer including a plain pattern uniformly spread;

said third wiring layer including first and second via pads formed on a surface of said wiring board;

a first via connecting said first via pad and said pattern;

a second via connecting said second via pad and at least one of said island patterns; and a plurality of third vias connecting said island patterns and said plain pattern.

10. A multilayer thin-film wiring board according to claim 9, wherein each of said windows is square in shape.

11. A multilayer thin-film wiring board according to claim 10, wherein:

said windows are arranged with the same pitch both in a lateral direction and in a longitudinal direction of said pattern;

each of said first and second via pads is square in shape; and the length of each side of each of said first and second via pads is greater than the sum of the pitch of said windows and the diameter of said first via.

12. A multilayer thin-film wiring board according to claim 9, wherein each of said windows is circular in shape.

13. A multilayer thin-film wiring board according to claim 9, wherein said pattern forms a power supply layer, and said plain pattern forms a ground layer.

14. A multilayer thin-film wiring board according to claim 9, wherein said dielectric layer is formed of polyimide.

15. A multilayer thin-film wiring board according to claim 9, further comprising a thick-film layer formed of ceramic.

* * * * *